(12) United States Patent
Iwata et al.

(10) Patent No.: US 7,547,359 B2
(45) Date of Patent: Jun. 16, 2009

(54) METHOD OF ALTERING CRYSTAL STRUCTURE OF GROUP 13 ELEMENT NITRIDE, GROUP 13 ELEMENT NITRIDE AND STRUCTURE MATERIAL CONTAINING CUBIC NITRIDE

(75) Inventors: Atsushi Iwata, Tsukuba (JP); Jun Akedo, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 245 days.

(21) Appl. No.: 10/549,848

(22) PCT Filed: Mar. 19, 2004

(86) PCT No.: PCT/JP2004/003739

§ 371 (c)(1),
(2), (4) Date: May 22, 2006

(87) PCT Pub. No.: WO2004/105931

PCT Pub. Date: Dec. 9, 2004

(65) Prior Publication Data
US 2007/0160872 A1 Jul. 12, 2007
US 2008/0003458 A2 Jan. 3, 2008

(30) Foreign Application Priority Data

Mar. 20, 2003 (JP) ............................. 2003-077389

(51) Int. Cl.
*C30B 25/12* (2006.01)
(52) U.S. Cl. .............................. 117/89; 117/93; 117/95; 117/105; 117/109; 117/923; 117/952
(58) Field of Classification Search ................... 117/89, 117/93, 95, 105, 109, 923, 952
See application file for complete search history.

(56) References Cited

FOREIGN PATENT DOCUMENTS

| JP | 55-056004 | 4/1980 |
| JP | 55-56004 | 4/1980 |
| JP | 58-204809 | 11/1983 |

OTHER PUBLICATIONS

Akewatashi, Jun et al., Ceramic Thin Film Formation Technology Using Collision and Solidification Phenomena of Particles and Ultra-fine Particles.—Aerosol Deposition Method for High Speed Coating at Low Temperature, National Institute of Advanced Industrial Science and Technology, Tsukuba, pp. 459-466, 2002, with Partial English Translation.
Kim, I.W. et al., Critical Thickness for Transformation of Epitaxially Stabilized Cubic AlN in Superlattices, Applied Physics Letters, vol. 78, No. 7, pp. 892-894, 2001.
Mashimo, Tsutomu et al., Yield Properties, Phase Transition, and equation of State of Aluminum Nitride (AlN) Under Shock Compression up to 15 GPa., Journal of Applied Physics, vol. 86, No. 12, pp. 6710-6716, 1999.

*Primary Examiner*—Felisa C Hiteshew
(74) *Attorney, Agent, or Firm*—Oblon, Spivak, McClelland, Maier & Neustadt, P.C.

(57) ABSTRACT

An aerosol of a powder composed of helium carrier gas and particles of a hexagonal aluminum nitride is charged through a transfer pipe 3 into a film deposition chamber 4 whose interior is depressurized by gas evacuation using a vacuum pump 5 to maintain a degree of vacuum of 200-8000 Pa during supply of the carrier gas and the aerosol is blown from a nozzle 6 provided on the end of the transfer pipe 3 inside the film deposition chamber 4 to impinge on a substrate fastened to a substrate holder 7 to make the impact force of the particles at collision with the substrate 4 GPa or greater, thereby transforming the crystal structure of the aluminum nitride from hexagonal to cubic to deposit cubic aluminum nitride on the substrate. As a result, a method of transforming the crystal structure of a Group XIII nitride is provided that enables transformation of a Group XIII nitride to cubic crystal structure using a system of simpler configuration than that used for transforming the crystal structure of a Group XIII nitride by a static pressure application process.

11 Claims, 5 Drawing Sheets

F I G. 2
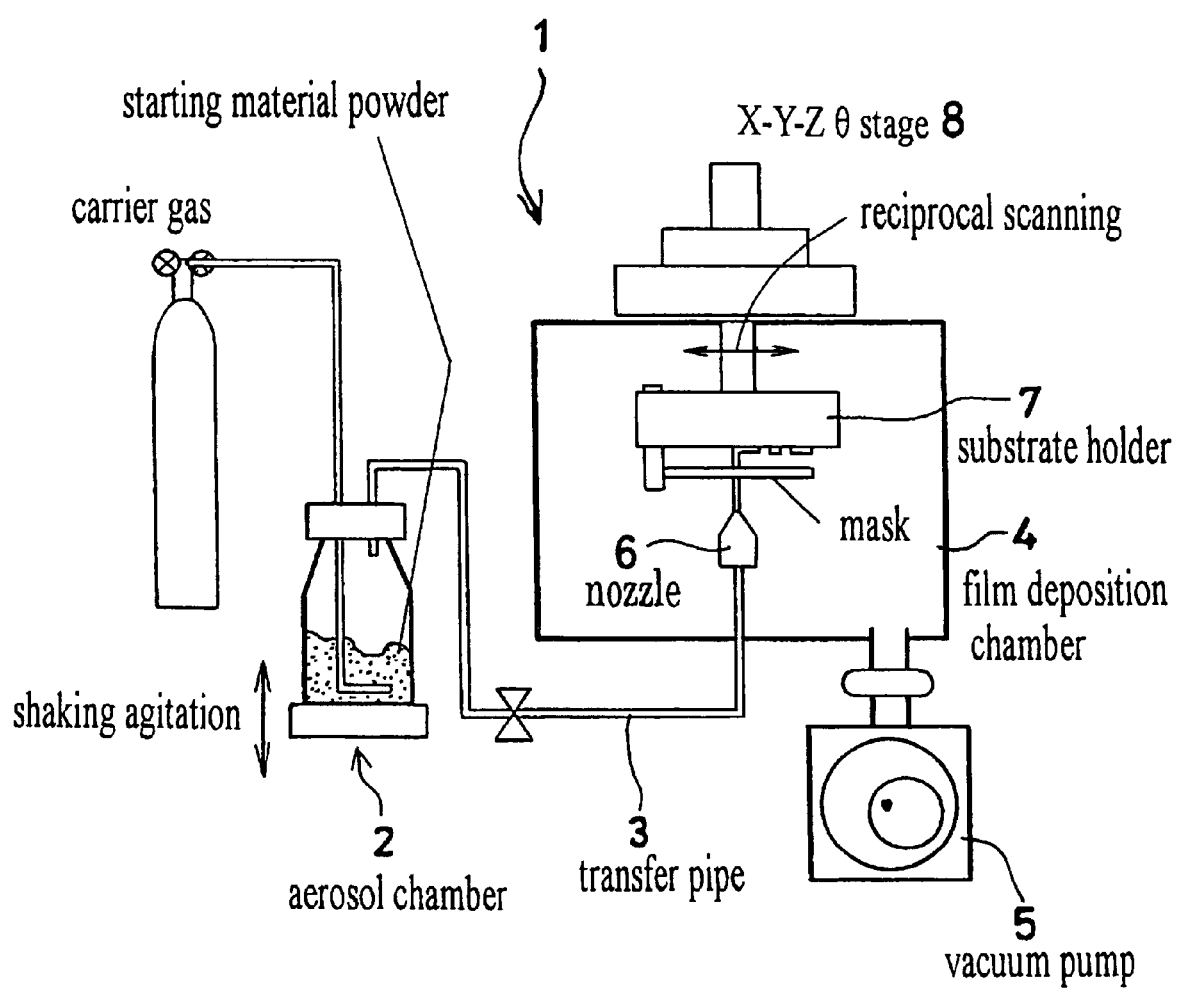

METHOD OF ALTERING CRYSTAL STRUCTURE OF GROUP 13 ELEMENT NITRIDE, GROUP 13 ELEMENT NITRIDE AND STRUCTURE MATERIAL CONTAINING CUBIC NITRIDE

TECHNICAL FIELD

This invention relates to a method of transforming the crystal structure of aluminum nitride, gallium nitride, indium nitride or other nitride known as a Group XIII nitride from hexagonal to cubic, a Group XIII nitride having a unique crystal structure, and a constituent containing a cubic nitride.

BACKGROUND ART

Cubic aluminum nitride, cubic gallium nitride and cubic indium nitride have a number of outstanding characteristics, including high hardness, high thermal conductivity, excellent high-temperature properties and high chemical resistance. This has led to their use in electronic circuit boards and the like. Because of their wide band gap, moreover, they have drawn attention as materials for short wavelength LEDs and the like. Aluminum nitride, gallium nitride and indium nitride assume the hexagonal wurtzite structure under normal temperature and normal pressure. Although they are also known to assume the cubic structure as a metastable system, cubic nitrides cannot ordinarily be obtained under normal temperature and pressure conditions.

Wurtzite structure aluminum nitride, for instance, transforms to cubic structure under application of a pressure of several tens of GPa or greater (see, for example, Mashimo, Uchino, Nakamura et al.: Yield properties, phase transition, and equation of state of aluminum nitride (AlN) under shock compression up to 150 GPa, Journal of Applied Physics, Vol. 86, No. 12, 1999, pp. 6710-6716).

Cubic nitride can also be epitaxially grown at a temperature of several hundred degrees Celsius or higher by conducting molecular beam epitaxy on a cubic substrate. This method produces only a very thin film of cubic nitride measuring several tens of nm in thickness (see, for example, Critical Thickness for Transformation of Epitaxially Stabilized Cubic AlN in Superlattices, I. W. Kim, Q. Li, L. D. Marks and S. A. Barnett, Applied Physics Letters 78, 7, 892 (2001)).

Transformation of the crystal structure of a Group XIII nitride from hexagonal to cubic by a static pressure application process (using a press or the like) thus requires application of a pressure of several tens of GPa. This method is therefore incapable of forming cubic nitride as a film on a substrate such as glass or metal. Production of cubic nitride by means of a thin film forming method is costly, is limited to particular substrates, and is incapable of producing film to a thickness greater than 0.1 µm. In addition, the properties of cubic nitrides such as cubic aluminum nitride, cubic gallium nitride and cubic indium nitride are not clearly known in detail owing to the difficulty of their production. These nitrides are, however, known to have better symmetry than hexagonal nitrides and to be low in carrier scattering. As such, they are expected, for example, to improve the efficiency of light-emitting devices and the like.

An object of the present invention is to provide a method of transforming the crystal structure of a Group XIII nitride that enables transformation of a Group XIII nitride to cubic crystal structure using a system of simpler configuration than that used for transforming the crystal structure of a Group XIII nitride by a static pressure application process. Another object of the present invention is to provide a Group XIII nitride unobtainable heretofore and a constituent containing a cubic nitride

DISCLOSURE OF THE INVENTION

For achieving these objects, the invention provides a method of transforming the crystal structure of a Group XIII nitride comprising: a step of generating an aerosol of a starting material powder composed of particles of a Group XIII nitride of hexagonal crystal structure in a carrier gas; and a step of blowing the aerosol onto a substrate in a depressurized film deposition chamber to make the impact force of the particles at collision with the substrate 4 GPa or greater, thereby transforming the crystal structure of the Group XIII nitride colliding with the substrate to cubic crystal structure.

In the invention method of transforming the crystal structure of a Group XIII nitride to cubic structure by blowing an aerosol composed of a starting material powder of a Group XIII nitride of hexagonal crystal structure and a carrier gas onto a substrate in a depressurized film deposition chamber, the impact force of the powder particles at collision with the substrate is 4 GPa or greater. A cubic nitride can therefore be readily produced under normal temperature using a system of simpler configuration than that used for transforming the crystal structure of a Group XIII nitride by a static pressure application process requiring a very high pressure of the order of several tens of GPa.

In the foregoing method of transforming the crystal structure of a Group XIII nitride according to the present invention, the impact force of the particles at collision with the substrate is made 4 GPa or greater by blowing the aerosol so as to make the particle velocity 300 m/s or greater.

The impact force of 4 GPa or greater necessary for transforming the crystal structure of the Group XIII nitride to cubic crystal structure is thus achieved by making the particle velocity 300 m/s or greater during blowing of the aerosol. This particle velocity therefore constitutes a parameter of system design.

This invention further provides a Group XIII nitride obtained by generating an aerosol of a starting material powder composed of particles of a Group XIII nitride of hexagonal crystal structure in a carrier gas and blowing the aerosol onto a substrate in a depressurized film deposition chamber to make the impact force of the particles at collision with the substrate between not less that 4 GPa and not greater than 9 GPa, which obtained Group XIII nitride comprises particles transformed to cubic crystal structure by collision with the substrate intermixed with particles still retaining the hexagonal crystal structure.

This Group XIII nitride comprising particles transformed to cubic crystal structure intermixed with particles still retaining the hexagonal crystal structure is unique to this invention and, specifically, such a Group XIII nitride including intermixed hexagonal and cubic crystal particles is impossible to produce by the conventional process of transforming the crystal structure of a Group XIII nitride from hexagonal to cubic using the static pressure application process.

This invention further provides a constituent containing a cubic nitride produced by generating an aerosol of a starting material powder composed of particles of a Group XIII nitride of hexagonal crystal structure in a carrier gas and blowing the aerosol onto a substrate of very thin wafer material in a depressurized film deposition chamber to make the impact force of the particles at collision with the substrate 4 GPa or greater, thereby transforming the crystal structure of the Group XIII nitride to cubic crystal structure by collision with the substrate to obtain the constituent containing a cubic nitride in the form of cubic nitride adhered to a substrate.

In the production of this constituent containing a cubic nitride, the individual particles collide with the substrate at an impact force of 4 GPa or greater. However, this is not a level of impact that causes damage to the substrate. As a result, it is possible to obtain a structure comprising cubic nitride adhered to a very thin substrate. Such formation of a cubic nitride film on a very thin substrate is impossible by the conventional process of transforming the crystal structure of a Group XIII nitride from hexagonal to cubic using the static pressure application process because the very thin substrate would not be able to withstand the impact during pressure application.

This invention further provides the foregoing constituent containing a cubic nitride, which is obtained by making the impact force of the particles at collision with the substrate 9 GPa or less, thereby causing the constituent containing a cubic nitride to comprise, as adhered to the substrate, particles of Group XIII nitride transformed to cubic crystal structure by collision with the substrate intermixed with particles of Group XIII nitride still retaining the hexagonal crystal structure.

By making the impact force of the particles at collision with the substrate 9 GPa or less, it becomes possible to obtain a constituent containing a cubic nitride that comprises, as adhered to the substrate, particles of Group XIII nitride transformed to cubic crystal structure by collision with the substrate intermixed with particles of Group XIII nitride still retaining the hexagonal crystal structure.

The above and other objects and features of the invention will become apparent from the following description made with reference to the accompanying drawings.

BRIEF DESCRIPTION OF THE DRAWINGS

FIG. 2 is a schematic diagram showing the configuration of an aerosol deposition system.

BEST MODE FOR CARRYING OUT THE INVENTION

An embodiment of the method of transforming the crystal structure of a Group XIII nitride according to the present invention will now be explained with reference to the attached drawings.

The crystal structure of a Group XIII nitride was changed from hexagonal to cubic using the aerosol deposition (AD) process. The AD process is a revolutionary ceramic coating technique capable of forming dense films of various ceramics at normal temperature (see Jun Akedo and Maxim Lebedev: Material, Vol. 41, No. 7 (2002), pp. 459-466). The inventors learned that when a starting material of readily available hexagonal aluminum nitride powder (particle diameter: 0.1 μm-0.5 μm) is jetted onto a substrate from a nozzle under reduced pressure in accordance with the AD process so that the impact force on the substrate is 4 GPa or greater, thereby depositing a film, it becomes possible to obtain a thick film of cubic aluminum nitride under a normal temperature atmosphere of slightly reduced pressure. This method can also be applied to obtain other Group XIII nitrides having a cubic crystal structure (cubic gallium nitride, cubic indium nitride and the like).

It should be noted that the conventional AD process forms a film using fine ceramic particles composed of a Group XIII nitride and is not directed to transforming the crystal structure of the starting material particles but focuses on forming a film by joining the particles together. The method of this invention operates on an entirely different principle of transforming a hexagonal nitride material to cubic crystal structure by bringing it into collision with a substrate at an impact force of 4 GPa or greater. Moreover, in the static pressure application process discussed above, a high pressure of 10 GPa or greater is required for transforming the crystal structure at the time of applying an impact force to the ceramic powder for solidification. In sharp contrast, a key feature of the method of this invention is that it can induce structural transformation of such a ceramic material at a small impact force below 10 GPa (namely an impact force of 4 GPa). This is believed to be because the invention method utilizes the impact force produced by collision of the starting material ceramic powder itself.

Figure 1:
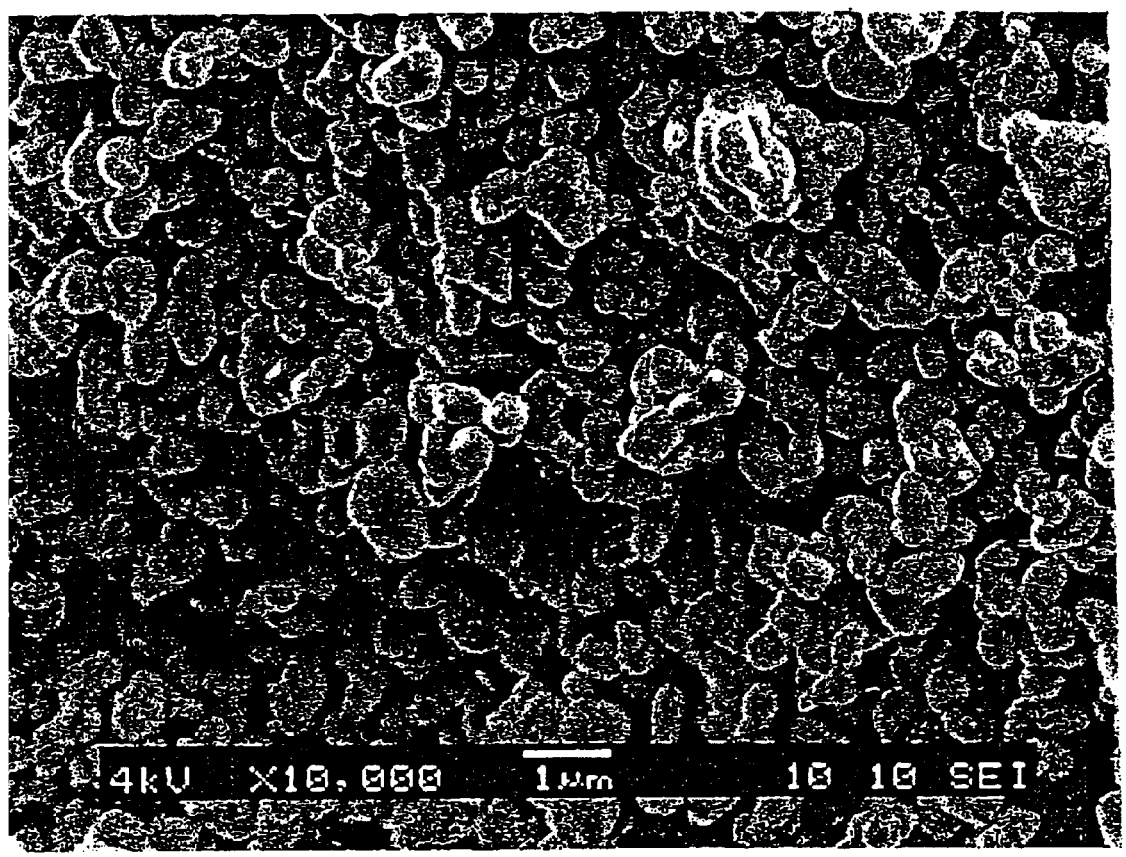
FIG. 1 is a micrograph of a hexagonal starting material (AlN) powder.

Research leading to the realization of this invention was done using as a starting material powder an aluminum nitride powder of wurtzite structure (−300 mesh, particle diameter: approx. 0.5 μm; product of Furuuchi Chemical Corporation). A scanning electron micrograph of the used starting material particles is shown in FIG. 1.

The general configuration of an AD system 1 used for film deposition by the AD process is shown in FIG. 2. Helium (He) was used as the carrier gas. Compressed helium gas was blown into an aerosol chamber 2 containing the starting powder to raise a cloud of the powder and establish an aerosol that was sent through a transfer pipe 3 to a film deposition chamber 4. The flow rate of the carrier gas was controlled to within 3-10 L/min. The interior of the film deposition chamber 4 was depressurized by gas evacuation using a vacuum pump 5 to maintain a degree of vacuum of 200-8000 Pa during flow of the carrier gas. (A high exhaust rate mechanical booster pump or rotary pump can be used as the vacuum pump 5.) The end of the transfer pipe 3 inside the film deposition chamber 4 was provided with a nozzle 6 having a slit-like opening measuring 10 mm×0.4 mm. The aerosol composed of the mixture of starting material powder and carrier gas was jetted from the nozzle 6 to pass through a mask and impinge on a substrate fastened to a substrate holder 7.

Slide glasses and quartz glasses were used as substrates. When the crystal structure of a Group XIII nitride is transformed by a process such as the static pressure application process that causes a pressure of several tens of GPa to act on the substrate, the substrate will disintegrate unless it has appropriate thickness. In the method according to this embodiment, however, the pressure acting on the substrate is low, the area on which the pressure acts is small and the acting force is also small, so that no substrate disintegration occurs. The thickness of the substrate is therefore not critical and a thin substrate of, for instance, around 10 mm thickness can be used. It is also possible to use a thin substrate of only around 0.2 mm thickness. The substrate was reciprocated over a distance of 10 mm at 1.2 mm/s using an X-Y-Z θ stage 8 adjustable to a transfer speed in the range of 0.1-10 mm/sec. As a result, the aerosol composed of the mixture of starting material particles and carrier gas collided with the substrate chiefly within an area measuring 10 mm by 10 mm.

The starting material powder and the film formed on the substrate were examined using an X-ray diffractometer (Rigaku Corporation: RINT-2100 VK/PC), an energy dispersive X-ray spectrometer (JEOL, Ltd.: JSM-5500 Electron Microscope+Oxford Instruments PLC: ISIS300), a micro-Vickers hardness tester (Akashi Corporation: AAV-4(M)) and other instruments.

Figure 3:
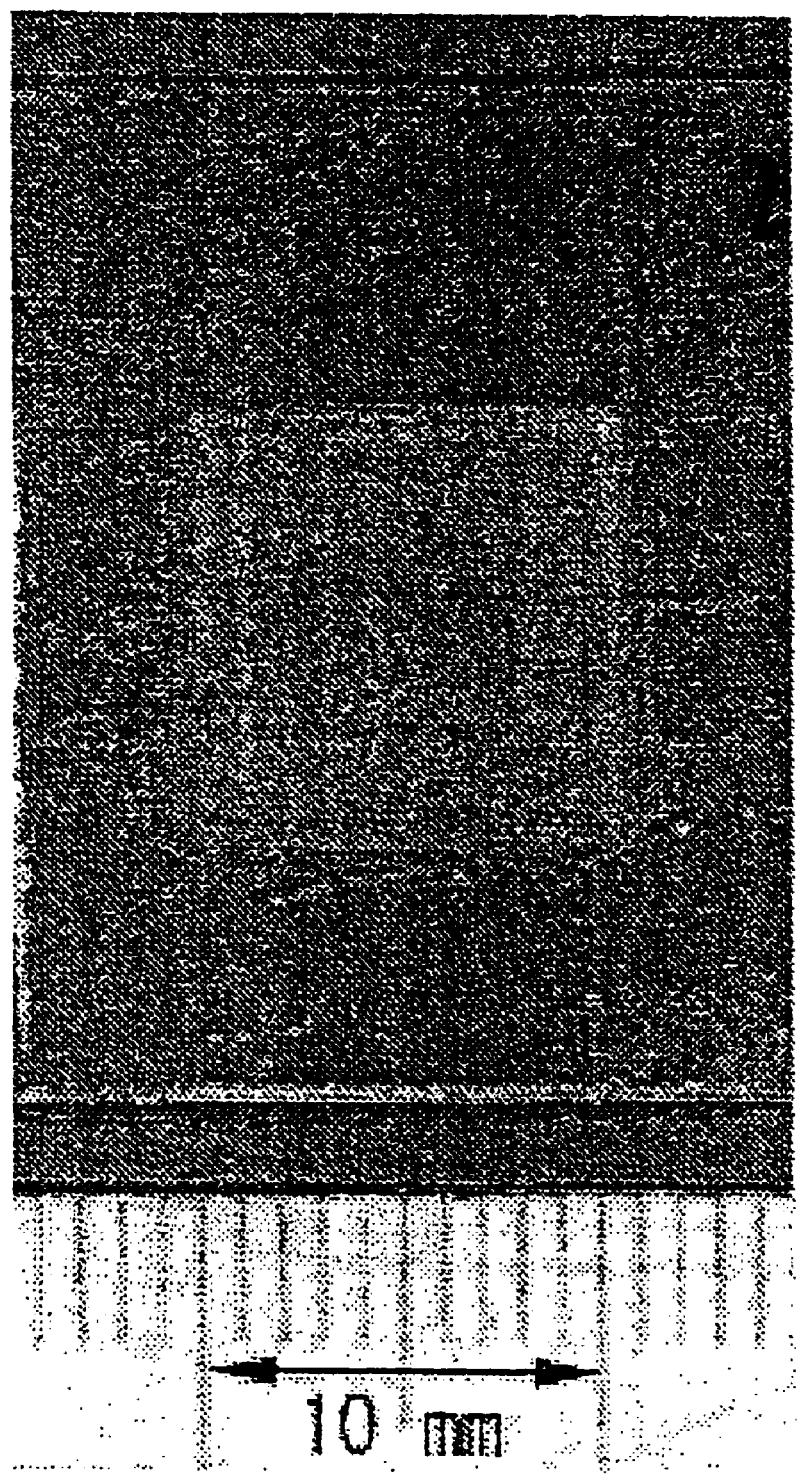
FIG. 3 is a photograph showing the appearance of an AlN film formed using the aerosol deposition (AD) process.

FIG. 3 is a photo showing the appearance of a film obtained by the method of this embodiment. The film extends over a 10 mm×10 mm area of the substrate. The thickness of the formed film can be controlled by controlling the deposition time, whereby it is possible to produce films ranging in thickness from thinner than 0.5 μm to thicker than 10 μm.

The Vickers hardness of formed films measured at a load of 0.4903 N was 900-1300 HV. This is about the same as the hardness of a sintered body of the starting material powder obtained using a hot press.

Figure 4:
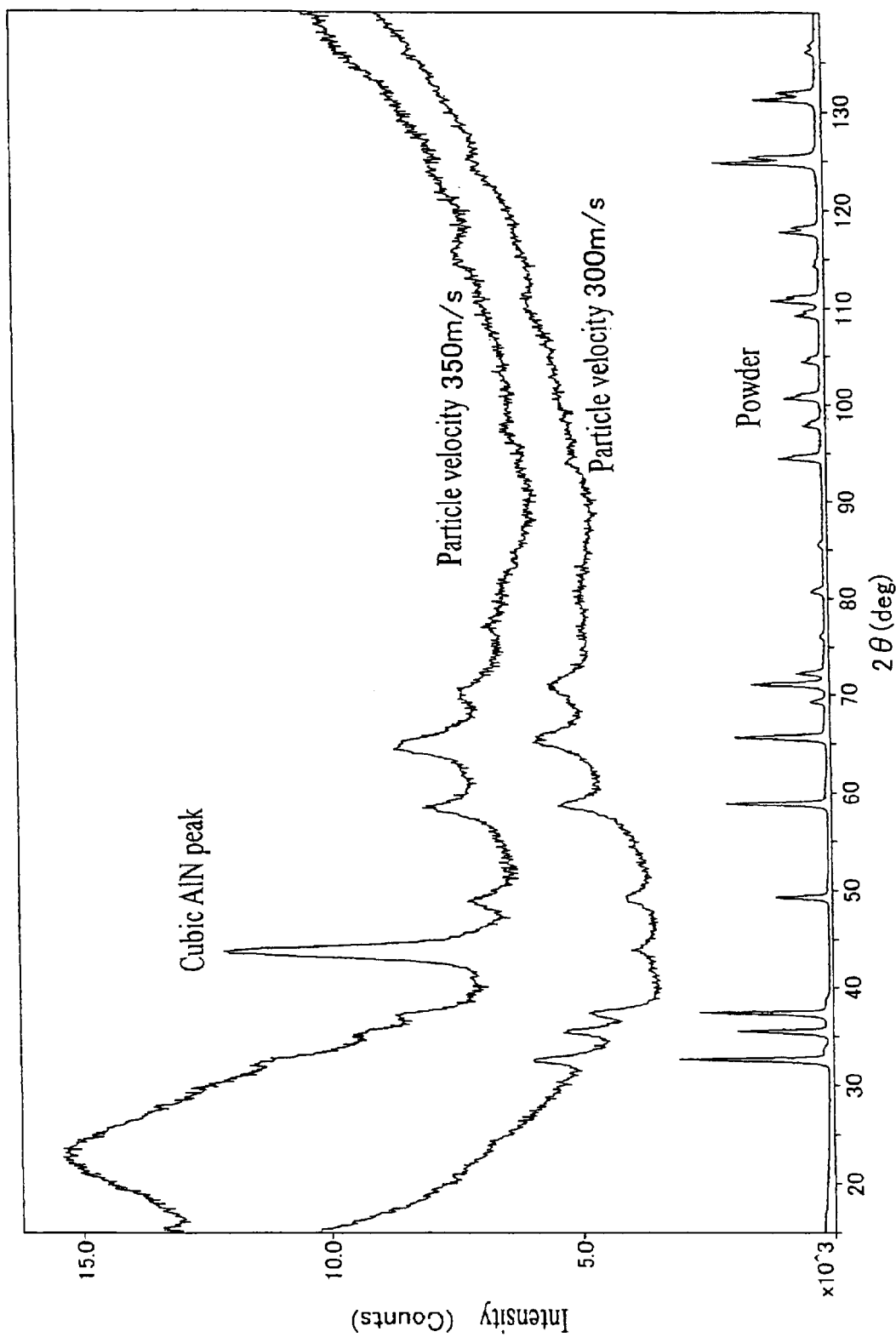
FIG. 4 shows the X-ray diffraction spectra of formed films and the starting powder.

Qualitative analysis of formed films using the energy dispersive X-ray spectrometer detected presence of Al, N and O. The X-ray diffraction results for the starting material powder and films are shown in FIG. 4. The formed films had the same peaks as the powder but the film peaks were different in intensity and peak width and were also somewhat shifted in position relative to those of the powder. In addition, the formed films exhibited a peak near 2θ of 44 degrees not observed for the starting material powder. This peak is attributable to cubic AlN. In other words, transformation of crystal structure (from hexagonal to cubic) occurred during the film deposition by the AD process.

The intensity ratio between this cubic peak and the hexagonal peak varies with the deposition conditions. In the case of films having randomly oriented crystal grains of approximately the same size, the peak intensities can be considered to indicate roughly the amounts present in the film. Films formed at different gas flow rates and deposition times were therefore formed and subjected to X-ray diffraction. The results are shown in Table 1.

TABLE 1

Deposition conditions vs. cubic peak

| Substrate | Gas flow rate L/min | Deposition time min | Film thickness μm | X-ray diffraction cubic peak |
|---|---|---|---|---|
| Slide glass | 6 | 3 | 3 | Low |
| Slide glass | 6 | 3 | 3.5 | Medium |
| Slide glass | 6 | 30 | 11 | Medium |
| Slide glass | 8 | 4 | 5 | High |
| Slide glass | 9 | 20 | 8 | High |
| Quartz glass | 10 | 17 | 4 | High |

From the results shown in Table 1, it can be seen that when the same nozzle was used the degree of conversion from hexagonal to cubic depended on the gas flow rate. Specifically, the conversion to cubic crystal structure increased (cubic nitride peak of the X-ray diffraction spectrum became higher) with increasing gas flow rate. From this it can be concluded that conversion to cubic crystal nitride increases with increasing particle collision velocity.

Figure 5:
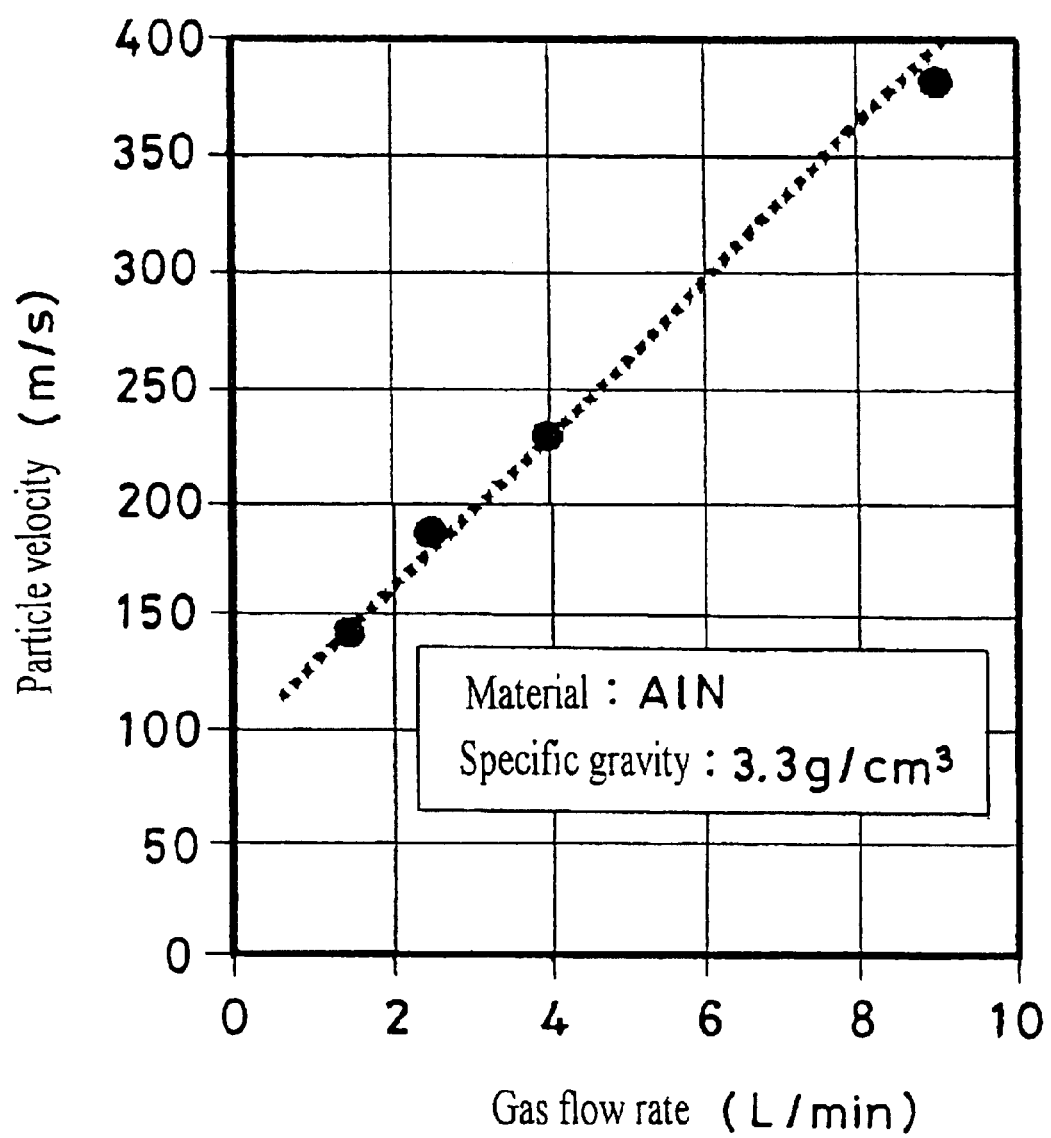
FIG. 5 is a characteristic curve showing carrier gas flow rate vs. particle velocity.

A particle velocity measurement method utilizing flight time difference was therefore used to determine the relationship between gas flow rate and particle velocity. The results are shown in FIG. 5. The impact force σ acting on a particle during film deposition is given by $\sigma = v \cdot (E \cdot \rho)^{1/2}/2$, where $v$ is particle velocity, $E$ is Young's modulus of the particle and $\rho$ is particle density. The pressure at particle collision determined by simulation from experimentally ascertained particle velocity was 6 GPa. However, Young's modulus E and other values are known only for particles in bulk and the values for individual particles are not known exactly. From the fact that a small cubic peak also appears in the X-ray diffraction spectrum for a particle velocity of 300 m/s shown in FIG. 4, if follows that slight transformation to cubic crystal structure also occurs at still lower velocities. In light of this, an impact force of at least 4 GPa was found adequate for achieving crystal structure transformation.

As can be seen from the foregoing, although a pressure of several tens of PGa or greater has conventionally been needed to transform Wurtzite structure aluminum nitride into cubic aluminum nitride by pressure application, use of the AD process to subject starting material particles to impulsive pressure (not static pressure) by bringing them into collision with a substrate enables ready transformation of aluminum nitride from Wurtzite structure to cubic crystal structure at a small pressure of 4 GPa, i.e., a pressure lower by an order of ten. From this it follows that the method of transforming the crystal structure of a Group XIII nitride by using the AD process to produce a particle impact force at collision with a substrate of 4 GPa or greater is superior to the method of transforming the crystal structure of a Group XIII nitride by the static pressure application process in the points of enabling simplification of system configuration and reduction of industrial production cost.

In the X-ray diffraction spectra shown in FIG. 4, the peaks observed for the films include not only the cubic peaks but also hexagonal peaks at the same position as the hexagonal peak of the powder. From this it follows that the films were composed of a mixture of cubic and hexagonal nitrides. This in turn means that by regulating the pressure on the particles at collision it is possible to produce a Group XIII nitride having an appropriate ratio of hexagonal crystal structure and cubic crystal structure. In addition, it is possible to adhere to an extremely thin glass or metal wafer a Group XIII nitride film comprising hexagonal crystal structure and cubic crystal structure intermixed at a suitable ratio.

When quartz glass was used as the substrate and the gas flow rate was set at 10 L/min (particle velocity of 450 m/s), a film composed almost entirely of cubic nitride was obtained. Quartz glass, which has a higher Young's modulus than slide glass, results in a higher impact force for a given particle velocity and therefore promotes transformation to cubic crystal structure more than does slide glass. From this it can be seen that a Group XIII nitride comprising a very high ratio of cubic crystal can be acquired by suitably establishing the conditions during particle collision. In addition, a film of Group XIII nitride comprising a very high ratio of cubic crystal can be adhered to a very thin glass or metal wafer.

In the deposition of films of brittle materials such as oxides and nitrides at normal temperature by the AD process, it has heretofore been possible to achieve refinement of the crystal texture of the formed film but the structure of the starting material particles has remained unchanged and no alteration of the crystal system has been possible. However, when an aerosol containing Group XIII nitride powder as the starting material is blown onto a base material (substrate) at a particle collision velocity of 300 m/s or greater (in the case of a nozzle opening measuring 10 mm by 0.4 mm, at a carrier gas flow rate of 6 L/min or greater), the impact force at particle collision becomes 4 GPa or greater to enable transformation of the nitride from hexagonal to cubic crystal structure under normal temperature condition. Moreover, a mixture of hexagonal crystal structure and cubic crystal structure can be realized by regulating the impact force at particle collision, and it is further possible to produce a constituent containing a cubic nitride by adhering nitride film to a very thin glass or metal wafer.

INDUSTRIAL APPLICABILITY

As set forth in the foregoing, in the method of transforming the crystal structure of a Group XIII nitride according to the present invention, an aerosol of a starting material powder composed of particles of a Group XIII nitride of hexagonal crystal structure in a carrier gas is blown onto a substrate in a depressurized film deposition chamber to make the impact force of the particles at collision with the substrate 4 GPa or greater, thereby transforming the crystal structure of the Group XIII nitride colliding with the substrate to cubic crystal structure. A cubic nitride can therefore be readily produced under normal temperature using a system of simpler configuration than that used for transforming the crystal structure of a Group XIII nitride by a static pressure application process requiring a very high pressure of the order of several tens of GPa.

Moreover, in the method of transforming the crystal structure of a Group XIII nitride according to the present invention, the impact force of 4 GPa or greater necessary for transforming the crystal structure of the Group XIII nitride to cubic crystal structure is achieved by making the particle velocity 300 m/s or greater during blowing of the aerosol. This particle velocity therefore constitutes a parameter of system design.

The Group XIII nitride according to the present invention comprises particles transformed to cubic crystal structure intermixed with particles still retaining the hexagonal crystal structure. Such intermixing of hexagonal and cubic crystal particles cannot be achieved by the conventional process of transforming the crystal structure of a Group XIII nitride from hexagonal to cubic using the static pressure application process.

In the production of the constituent according to the present invention, the individual particles collide with the substrate at an impact force of 4 GPa or greater. However, this is not a level of impact that causes damage to the substrate. As a result, it is possible to obtain a structure comprising cubic nitride adhered to a very thin substrate. Such formation of a cubic nitride film on a very thin substrate is impossible by the conventional process of transforming the crystal structure of a Group XIII nitride from hexagonal to cubic using the static pressure application process because the very thin substrate would not be able to withstand the impact during pressure application.

The constituent containing a cubic nitride according to the present invention can, by making the impact force of the particles at collision with the substrate 9 GPa or less, be obtained as a constituent comprising, as adhered to a very thin substrate, particles of Group XIII nitride transformed to cubic crystal structure by collision with the substrate intermixed with particles of Group XIII nitride still retaining the hexagonal crystal structure.

What is claimed is:

1. A method of transforming a crystal structure of a Group XIII nitride comprising:
    generating an aerosol comprising particles of a Group XIII nitride having a hexagonal crystal structure and a carrier gas; and
    blowing the aerosol onto a substrate in a depressurized film deposition chamber to make an impact force of the particles at collision with the substrate of 4 GPa or greater, thereby transforming the crystal structure of at least a portion of the Group XIII nitride particles colliding with the substrate to a cubic crystal structure.

2. A method of transforming the crystal structure of a Group XIII nitride according to claim 1, wherein the impact force of the particles at collision with the substrate is made to be 4 GPa or greater by blowing the aerosol so as to make a particle velocity 300 m/s or greater.

3. A method of transforming the crystal structure of a Group XIII nitride according to claim 1, wherein the impact force of the particles at collision with the substrate is not less than 4 GPa and not greater than 9 GPa.

4. A method of transforming the crystal structure of a Group XIII nitride according to claim 1, wherein Group XIII nitride particles transformed to a cubic crystal structure are intermixed with Group XIII nitride particles retaining a hexagonal crystal structure.

5. A method of transforming the crystal structure of a Group XIII nitride according to claim 1, wherein at least a portion of the Group XIII nitride particles having a cubic crystal structure adhere to the substrate to form a film thereon.

6. A method of transforming the crystal structure of a Group XIII nitride according to claim 5, wherein the Vickers hardness of the film measured at a load of 0.4903 N is 900-1300 HV.

7. A method of transforming the crystal structure of a Group XIII nitride according to claim 1, wherein the film deposition chamber is depressurized by gas evacuation to maintain a degree of vacuum of 200-8000 Pa during the blowing of the aerosol onto the substrate.

8. A method of transforming the crystal structure of a Group XIII nitride according to claim 1, wherein the Group XIII nitride is selected from the group consisting of aluminum nitride, gallium nitride, and indium nitride.

9. A method of transforming the crystal structure of a Group XIII nitride according to claim 1, wherein the Group XIII nitride particles have a diameter of 0.1 µm-0.5 µm.

10. A method of transforming the crystal structure of a Group XIII nitride according to claim 1, wherein the carrier gas is helium.

11. A method of transforming the crystal structure of a Group XIII nitride according to claim 1, wherein the substrate is a glass substrate having a thickness of 0.2 mm-10 mm.

* * * * *